United States Patent
Zhang et al.

(10) Patent No.: US 9,960,049 B2
(45) Date of Patent: May 1, 2018

(54) TWO-STEP FLUORINE RADICAL ETCH OF HAFNIUM OXIDE

(71) Applicant: Applied Materials, Inc., Santa Clara, CA (US)

(72) Inventors: Hanshen Zhang, Cupertino, CA (US); Jie Liu, Sunnyvale, CA (US); Zhenjiang Cui, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days. days.

(21) Appl. No.: 15/161,783

(22) Filed: May 23, 2016

(65) Prior Publication Data

US 2017/0338119 A1    Nov. 23, 2017

(51) Int. Cl.
| H01L 21/3065 | (2006.01) |
| H01L 21/311 | (2006.01) |
| H01J 37/32 | (2006.01) |

(52) U.S. Cl.
CPC .... H01L 21/3065 (2013.01); *H01J 37/32357* (2013.01); *H01J 37/32422* (2013.01); *H01L 21/31122* (2013.01)

(58) Field of Classification Search
None
See application file for complete search history.

(56) References Cited

U.S. PATENT DOCUMENTS

| 6,020,271 | A  * | 2/2000 | Yanagida | H01L 21/7684 257/E21.583 |
| 7,829,243 | B2 | 11/2010 | Chen et al. | |
| 7,943,005 | B2 | 5/2011 | Kumar et al. | |
| 8,258,512 | B2 | 9/2012 | Nishi et al. | |
| 8,349,128 | B2 | 1/2013 | Todorow et al. | |
| 8,557,709 | B2 | 10/2013 | Sumiya et al. | |
| 8,765,574 | B2  * | 7/2014 | Zhang | H01J 37/32357 438/424 |
| 8,951,429 | B1  * | 2/2015 | Liu | H01J 37/32449 216/67 |
| 8,980,763 | B2  * | 3/2015 | Wang | H01L 21/32136 216/37 |
| 9,064,815 | B2 | 6/2015 | Zhang et al. | |
| 9,064,816 | B2  * | 6/2015 | Kim | H01L 21/31122 |
| 9,275,834 | B1  * | 3/2016 | Park | H01J 37/3244 |

(Continued)

FOREIGN PATENT DOCUMENTS

WO    2012052858 A1    4/2012

*Primary Examiner* — Allan Olsen
(74) *Attorney, Agent, or Firm* — Patterson + Sheridan LLP

(57) ABSTRACT

In one implementation, a method of removing a metal-containing layer is provided. The method comprises generating a plasma from a fluorine-containing gas. The plasma comprises fluorine radicals and fluorine ions. The fluorine ions are removed from the plasma to provide a reactive gas having a higher concentration of fluorine radicals than fluorine ions. A substrate comprising a metal-containing layer is exposed to the reactive gas. The reactive gas dopes at least a portion of the metal-containing layer to form a metal-containing layer doped with fluorine radicals. The metal-containing layer doped with fluorine radicals is exposed to a nitrogen and hydrogen containing gas mixture and the reactive gas to remove at least a portion of the metal-containing layer doped with fluorine radicals.

16 Claims, 4 Drawing Sheets

(56) References Cited

U.S. PATENT DOCUMENTS

| | | | |
|---|---|---|---|
| 9,496,167 B2* | 11/2016 | Purayath | H01L 21/764 |
| 2001/0041444 A1 | 11/2001 | Shields et al. | |
| 2005/0164479 A1* | 7/2005 | Perng | H01L 21/28194 |
| | | | 438/591 |
| 2006/0000802 A1 | 1/2006 | Kumar et al. | |
| 2006/0000805 A1 | 1/2006 | Todorow et al. | |
| 2006/0081558 A1* | 4/2006 | Collins | H01J 37/32082 |
| | | | 216/67 |
| 2006/0166107 A1 | 7/2006 | Chen et al. | |
| 2008/0085604 A1 | 4/2008 | Hoshino et al. | |
| 2008/0099431 A1 | 5/2008 | Kumar et al. | |
| 2010/0187534 A1 | 7/2010 | Nishi et al. | |
| 2011/0226734 A1 | 9/2011 | Sumiya et al. | |
| 2012/0238103 A1* | 9/2012 | Zhang | H01J 37/32422 |
| | | | 438/720 |
| 2013/0082197 A1 | 4/2013 | Yang et al. | |
| 2014/0024138 A1* | 1/2014 | Kwon | H01L 21/3065 |
| | | | 438/3 |
| 2014/0166617 A1* | 6/2014 | Chen | H01L 21/31122 |
| | | | 216/67 |
| 2014/0227881 A1* | 8/2014 | Lubomirsky | H01J 37/32357 |
| | | | 438/710 |
| 2015/0126040 A1* | 5/2015 | Korolik | H01L 21/3065 |
| | | | 438/718 |
| 2015/0214066 A1* | 7/2015 | Luere | H01L 21/02063 |
| | | | 438/696 |
| 2016/0064212 A1 | 3/2016 | Thedjoisworo et al. | |

* cited by examiner

TWO-STEP FLUORINE RADICAL ETCH OF HAFNIUM OXIDE

BACKGROUND

Field

Implementations described herein generally relate to methods and systems for removing metal-containing materials from a substrate and more particularly, to methods and systems for removing metal and metal oxide materials from a semiconductor substrate using fluorine radicals.

Description of the Related Art

Integrated circuits are made possible by processes which produce intricately patterned layers of materials on substrate surfaces. Producing patterned material on a substrate includes controlled methods for removal of exposed materials. Chemical etching is used for a variety of purposes including transferring a pattern in photoresist into underlying layers, thinning layers, or increasing lateral dimensions of features already present on the surface.

Plasma etching processes for fabricating semiconductor integrated circuits have been in wide use for decades. These processes typically involve the formation of a plasma from gases that are exposed to electric fields of sufficient power inside the processing chamber to cause the gases to ionize. The temperatures needed to form these plasmas can be much lower than needed to thermally ionize the same gases. Thus, plasma generation processes can be used to generate reactive radical and ion species at significantly lower chamber processing temperatures than is possible by simply heating the gases. This allows the plasma to etch materials from substrate surfaces without raising the substrate temperature above a threshold that will melt, decompose, or otherwise damage materials on the substrate.

Plasma etching processes include exposing selected parts of the substrate to plasma activated etching species that chemically react and/or physically sputter materials from the substrate. The removal rates, selectivity, and direction of the plasma-etched materials can be controlled with adjustments to the etchant gases, plasma excitation energy, and electrical bias between the substrate and charged plasma species, among other parameters.

While plasma environments are generally less destructive to substrates than high-temperature deposition environments, they still create fabrication challenges. Etching precision can be a problem with energetic plasmas that over-etch shallow trenches and gaps. Energetic species in the plasmas, especially ionized species, can create unwanted reactions in a deposited material that could lead to charge build-up and adversely affect the material's performance.

Another method of chemical etching involves exposing a material to a wet etchant to remove the material. However, as feature sizes decrease, wet etchants often fail to reach small features sometimes leading to pattern collapse.

Thus, there is a need for systems and methods to provide more precise control over an etching process performed during substrate fabrication while reducing damage to the substrate and features formed on the substrate.

SUMMARY

Implementations described herein generally relate to methods and systems for removing metal-containing materials from a substrate and more particularly, to methods and systems for removing metal and metal oxide materials from a semiconductor substrate using fluorine radicals. In one implementation, a method is provided. The method comprises flowing a fluorine-containing gas mixture into a plasma generation volume of a substrate-processing chamber. Energy is applied to the fluorine-containing gas mixture to generate a plasma in the plasma generation volume, the plasma comprising fluorine radicals and fluorine ions. The plasma is filtered to provide a reactive gas having a higher concentration of fluorine radicals than fluorine ions. The reactive gas is flowed into a processing volume of the substrate-processing chamber. The processing volume contains a substrate comprising a metal-containing layer. The substrate is exposed to the reactive gas in the processing volume of the substrate-processing chamber. The reactive gas dopes at least a portion of the metal-containing layer to form a metal-containing layer doped with fluorine radicals. The metal-containing layer doped with fluorine radicals is exposed to a nitrogen and hydrogen containing gas mixture to remove at least a portion of the metal-containing layer doped with fluorine radicals.

In another implementation, a method is provided. The method comprises generating a plasma from a fluorine-containing gas. The plasma comprises fluorine radicals and fluorine ions. The fluorine ions are removed from the plasma to provide a reactive gas having a higher concentration of fluorine radicals than fluorine ions. A substrate comprising a metal-containing layer is exposed to the reactive gas. The reactive gas dopes at least a portion of the metal-containing layer to form a metal-containing layer doped with fluorine radicals. The metal-containing layer doped with fluorine radicals is exposed to a nitrogen and hydrogen containing gas mixture and the reactive gas to remove at least a portion of the metal-containing layer doped with fluorine radicals.

In yet another implementation, a method is provided. The method comprises generating a plasma from a fluorine-containing gas comprising $NF_3$ and He. The plasma comprises fluorine radicals and fluorine ions. A portion of the fluorine ions are removed from the plasma to provide a reactive gas containing the fluorine radicals. The plasma is substantially free or free from ions. A substrate comprising a hafnium oxide-containing layer is exposed to the reactive gas. The reactive gas dopes at least a portion of the hafnium oxide-containing layer to form a hafnium oxide-containing layer doped with fluorine radicals. The hafnium oxide-containing layer doped with fluorine radicals is exposed to an ammonia ($NH_3$) containing gas mixture and the reactive gas to remove at least a portion of the hafnium oxide-containing layer doped with fluorine radicals.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of the present disclosure and are therefore not to be considered limiting of its scope, for the disclosure may admit to other equally effective implementations.

Figure 1:
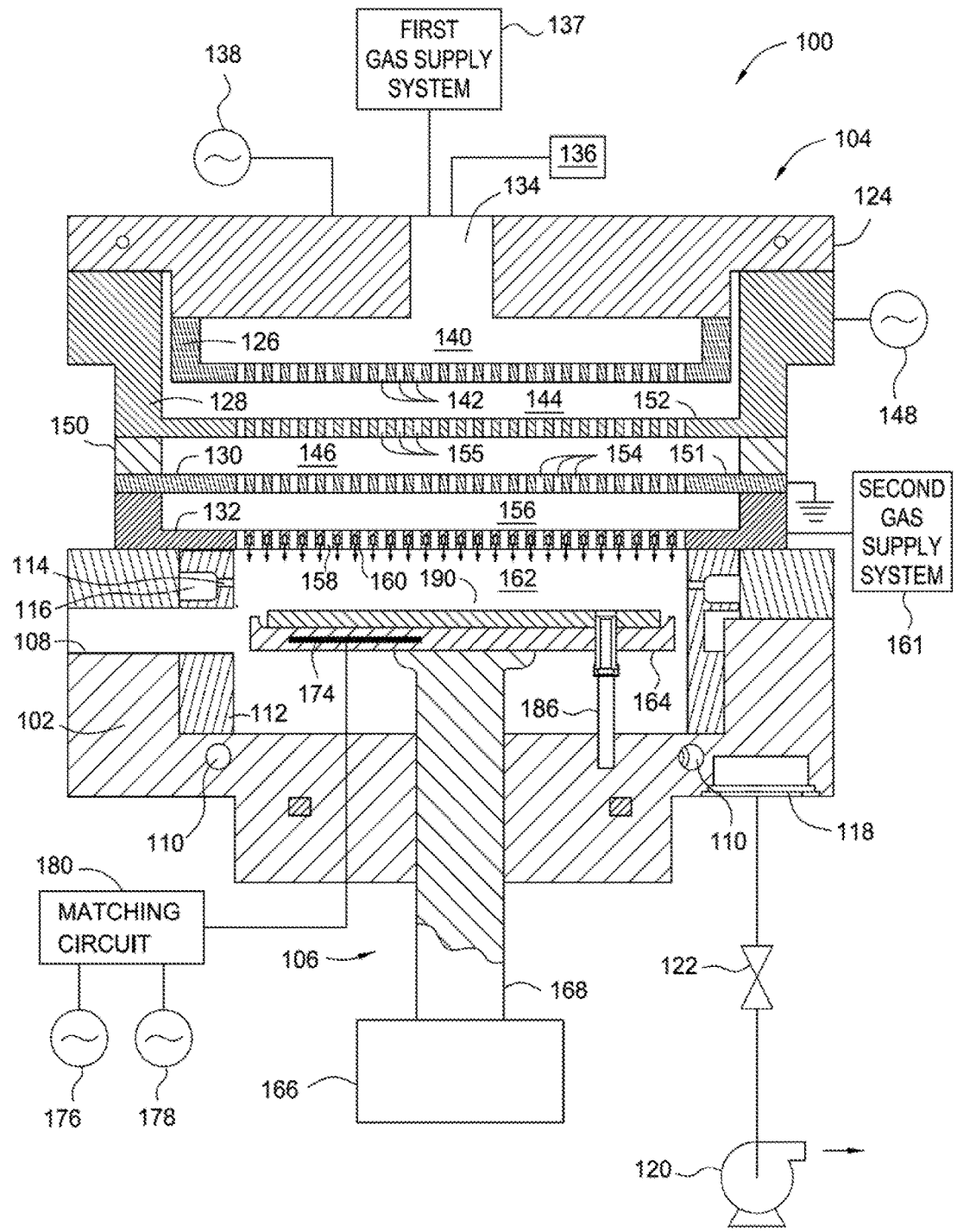
FIG. 1 is a schematic cross-sectional view of a plasma processing chamber according to one or more implementations of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes fluorine radical doping and etching of a substrate. Certain details are set forth in the following description and in FIGS. 1 to 4 to provide a thorough understanding of various implementations of the disclosure. Other details describing well-known structures and systems often associated with doping and etching are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to an etching process that can be carried out using an etching system, such as the PRODUCER® ETCH available from Applied Materials, Inc. of Santa Clara, Calif. Other tools capable of performing processes may also be adapted to benefit from the implementations described herein. In addition, any system enabling radical etch processes described herein can be used to advantage. The apparatus description described herein is illustrative and should not be construed or interpreted as limiting the scope of the implementations described herein.

The present disclosure relates to the vacuum-based radical etch processes. The process primarily uses radicals generated through a plasma source, but no ions, to selectively react with substrate films. Hafnium oxide ($HfO_2$) is a relatively inert material with an extremely high dielectric constant and is widely used in the transistor gate layers of semiconductor devices. In current device architecture, hafnium oxide is by far the material of highest dielectric constant and thus functions as insulating material. Traditionally, sputter etch methods are used for the removal of hafnium oxide materials. However, these traditional sputter etch methods suffer from the intrinsic problem of charge build-up. Traditional wet etch methods involve exposing a material to a wet etchant to remove the material. However, as features sizes decrease, these wet etchants often fail to reach small features sometimes leading to pattern collapse. In the present disclosure, hafnium oxide is removed using a radical only etch process. Advantageously, the radical only etch process does not induce charge build-up while reducing damage to the substrate and features formed on the substrate.

In one implementation, a metal containing material, (e.g., metal-containing oxides, such as hafnium oxide) is doped with fluorine radicals. The doping operation may be performed by striking the plasma in the plasma cavity with plasma sustaining gas (e.g., Ar or He), and a fluorine feedstock gas (e.g., $NF_3$ or $F_2$) to generate fluorine ions and fluorine radicals. The generated fluorine radicals are filtered through a SMD (selective modification device, which removes ions from the fluorine radical/ion mixture) and the fluorine radicals arrive at the substrate level. The fluorine radicals are highly reactive and when the fluorine radicals contact the metal-containing material, the fluorine radicals infiltrate into the metal-containing material. Fluorine atoms replace some of the oxygen atoms in the metal-containing material.

Next, the fluorine-doped metal-containing material is etched away. The etching process includes a top fluorine radical stream similar to the fluorine radical stream produced in the doping process as well as a nitrogen and hydrogen containing species. The nitrogen and hydrogen containing species (e.g., $N_2$, $H_2$, $NH_3$, or combinations thereof) may be supplied by a secondary gas injection. Then the secondary gas injection meets with the fluorine radicals in the gas distribution plate to form some species of $NH_3.H$. The species of $NH_3.H$ etches away the fluorine doped hafnium oxide material.

FIG. 1 illustrates a cross-sectional view of an exemplary processing chamber 100 that may be used to process a substrate 190 (e.g., a semiconductor substrate). The processing chamber 100 may be particularly useful for performing a thermal or plasma-based process. For example, the processing chamber 100 may be configured to dry etch or remove a material from a substrate. The processing chamber 100 is particularly suited for isotropic dry etching of a material with high selectivity and minimum damage to the substrate. In one implementation, the dry etching is performed using fluorine-containing gas and a nitrogen and hydrogen containing gas. Processing chambers that may be adapted for practicing implementations of the present disclosure may include, but is not limited to, processing chambers, available from Applied Materials, Inc. in Santa Clara, Calif. It is noted that other vacuum processing chambers, including those available from other manufactures may also be adapted to practice various implementations of present disclosure.

In one implementation, the processing chamber 100 is a capacitively coupled plasma processing chamber that provides thermal and plasma processing of a substrate. The processing chamber 100 may be configured to operate at a pressure level of less than about 20 Torr, for example, about 1 Torr. The processing chamber 100 generally includes a chamber body 102, a lid assembly 104, and a pedestal heater 106. The lid assembly 104 is disposed at an upper end of the chamber body 102, and the pedestal heater 106 is at least partially disposed within the chamber body 102, for example, at the opposite end of the chamber body 102 relative to the lid assembly 104. The chamber body 102 also includes a slit valve opening 108 formed in a sidewall thereof to provide access to an interior of the processing chamber 100. The slit valve opening 108 is selectively opened and closed to allow access to the interior of the chamber body 102 by an external substrate handling robot (not shown).

In one or more implementations, the chamber body 102 includes a channel 110 formed therein for flowing a heat transfer fluid therethrough. The heat transfer fluid can be a heating fluid or a coolant and is used to control the temperature of the chamber body 102 during processing.

The chamber body 102 may further include a liner 112 that surrounds the pedestal heater 106. The liner 112 is removable for servicing and cleaning. The liner 112 can be made of a metal or metal alloy such as aluminum or stainless steel, a ceramic material such as aluminum nitride or aluminum oxide, or any other process compatible material. In one or more implementations, the liner 112 includes one or more apertures 114 and a pumping channel 116 formed through the liner 112 that is in fluid communication with a vacuum port 118. The apertures 114 provide a flow path for gases within the interior of the processing chamber 100 to enter the pumping channel 116, which routes the gases within the processing chamber 100 to the vacuum port 118. A vacuum system is coupled to the vacuum port 118 to regulate the flow of gases through the processing chamber 100. The vacuum system includes a vacuum pump 120 and a throttle valve 122.

The lid assembly 104 includes a plurality of stacked components configured to form one or more volumes therebetween. In one implementation, the lid assembly 104 includes a lid 124, a blocker 126, a faceplate 128, a selective modulation device (SMD) 130 (e.g., ion suppressor), and a gas distribution plate 132. In one implementation, the gas distribution plate 132 is a dual-zone gas distribution plate. The lid 124 is coupled to a first power source 138, such as an RF power supply, configured to operate at between about 0 and about 3000 W at a frequency between about 400 kHz and about 60 MHz. In one example, the first power source 138 is configured to deliver about 30 Watts to about 1500 Watts at a frequency of about 13.56 MHz. In one implementation, the lid 124 may include one or more embedded channels or passages 125 for housing a heater or routing heating fluid to provide temperature control of the lid assembly 104.

The lid 124 includes an inlet 134, which is in fluid communication with a remote plasma generator 136. A first gas supply system 137 is coupled with the inlet 134 for supplying plasma-generating gases. In one implementation, the first gas supply system 137 provides plasma-generating gases (e.g., a fluorine-containing gas (e.g., $F_2$, $NF_3$, or both) and optionally an inert gas (e.g., He or Ar)). The plasma-generating gases may be used to strike a plasma in a third volume or plasma generation volume 146, or may maintain a plasma that has already been formed. In some implementations, the plasma-generating gases may have already been at least partially converted into plasma-excited species using the remote plasma generator 136 before travelling downstream through the inlet 134. When the plasma-excited species reach the plasma generation volume 146, they may be further excited or pass through without further excitation.

The lid 124 is disposed vertically above the blocker 126 and configured to deliver a first plasma through the inlet 134 from the remote plasma generator 136 into a first volume 140 confined between the lid 124 and the blocker 126.

The blocker 126 is coupled to the lid 124 (therefore RF hot) and includes a plurality of apertures 142 configured to filter out neutral species from the first plasma to allow ions and radicals to pass therethrough. The blocker 126 is disposed vertically above the faceplate 128, predominantly allowing only ions and radicals from the first plasma to enter a second volume 144 confined between the blocker 126 and the faceplate 128. Ions and radicals from the first plasma in the second volume 144 are distributed through the faceplate 128 to the plasma generation volume 146.

In one implementation, the faceplate 128 and the SMD 130 form an upper and lower electrode, respectively, confining the plasma generation volume 146 therebetween. The faceplate 128 is connected to a second power source 148, such as an RF power supply, and the SMD 130 is connected to ground, forming a capacitance between the faceplate 128 and the SMD 130. If desired, the SMD 130 may electrically float. The faceplate 128 and the SMD 130 may be made of highly doped silicon or metal, such as aluminum, stainless steel, etc. In some implementations, the faceplate 128 and the SMD 130 may be coated with a protective layer comprising alumina or yttrium oxide. An isolator 150 is disposed between the faceplate 128 and the SMD 130 and configured to electrically isolate the faceplate 128 and the SMD 130. In one implementation, the isolator 150 is fabricated from a ceramic.

The faceplate 128 may include a perforated plate 152. A plurality of apertures 155 in the faceplate 128 are configured to uniformly deliver the ions and radicals from the second volume 144 to the plasma generation volume 146. The SMD 130 may include a perforated plate 151 having a plurality of apertures 154. The plurality of apertures 154 in the SMD 130 are configured to control the ion/radical ratio to tune the gas selectivity provided to a fourth volume 156 defined between the SMD 130 and the gas distribution plate 132. The SMD 130 is configured to filter out a desired amount of ions and allow a desired amount of radicals to pass therethrough to the fourth volume 156. The ion/radical ratio may be selected based on the processing requirements.

The apertures 154 of the SMD 130 may be dimensionally and/or geometrically structured so that the passage of ionically charged species (i.e., plasma) is prevented and/or controlled while the passage of uncharged neutral or radical species (i.e., reactive gas) is permitted.

The gas distribution plate 132 may be a substantially disc-shaped component including a plurality of first apertures 158 and a plurality of second apertures 160 to distribute the flow of gases therethrough. The first and second apertures 158,160 form the gas distribution plate (e.g., the dual-zone gas distribution plate) disposed above the pedestal heater 106. In one implementation, the first apertures 158 are configured to deliver the desired amount of ions and radicals from the fourth volume 156 to a processing volume 162 defined between the gas distribution plate 132 and the pedestal heater 106. In one implementation, the second apertures 160 are in fluid communication with a second gas supply system 161 and configured to deliver the second gas to the processing volume 162 from a sidewall of the gas distribution plate 132. In another implementation, the second gas supply system 161 is configured to deliver the second gas directly into the processing volume 162, for example, via another gas distributor. Therefore, the gas distribution plate 132 advantageously delivers at least two different chemistries to the processing volume 162, and allows the second gas to bypass the first volume 140, the second volume 144, the plasma generation volume 146 and the fourth volume 156 having the first gas. The gas distribution plate 132 may be configured to distribute the first gas having the desired ion/radical ratio and second gas across a surface of the substrate 190. In various examples, the first gas and/or second gas may be an etchant or a neutral radical, such as fluorine radicals, chlorine radicals, or ammonia, or an oxidizing agent, such as ozone. In some implementations, the first gas includes a fluorine-containing gas (e.g., $NF_3$, $F_2$, or both), which is passed through the SMD to provide the fluorine radicals, and optionally an inert gas (e.g., He, Ar).

In some implementations, the second gas may include a nitrogen and hydrogen containing gas (e.g., $NH_3$).

The pedestal heater 106 may include a support plate 164 having a flat, or a substantially flat, surface for supporting the substrate 190 thereon during processing. The support plate 164 may be coupled to an actuator 166 by a shaft 168, which extends through a centrally-located opening formed in a bottom surface of the chamber body 102. The actuator 166 may be flexibly sealed to the chamber body 102 by bellows (not shown) that prevent vacuum leakage from around the shaft 168. The actuator 166 allows the support plate 164 to be moved vertically within the chamber body 102 between a process position and a lower transfer position. The transfer position is slightly below the slit valve opening 108 formed in the sidewall of the chamber body 102.

The pedestal heater 106 can include one or more bores formed through the support plate 164 to accommodate lift pin(s) 186, which is used for substrate handling and transport. The lift pin 186 is movable within the bore. When actuated, the lift pin 186 projects upward out of the bores and pushes against a backside surface of the substrate 190, lifting the substrate 190 off the support plate 164. Conversely, the lift pin 186 may be retracted from the extended position to lower the substrate 190, resting the substrate 190 on the support plate 164.

In some implementations, the substrate 190 may be secured to the support plate 164 using a vacuum chuck or an electrostatic chuck. An electrostatic chuck may include at least a dielectric material that surrounds an electrode 174, which may be located within the support plate 164. The electrode 174 may be coupled to a plurality of RF bias power sources 176,178. The dual RF bias power sources 176,178 are coupled to the electrode 174 through a matching circuit 180. The RF bias power sources 176,178 are generally capable of producing an RF signal having a frequency of from about 50 kHz to about 200 MHz and a power between about 0 Watts to about 5000 Watts. Additional bias power sources may be coupled to the electrode 174 to control the characteristics of the plasma as needed. The support plate 164 may have two or more heating zones, and the temperature of some of the heating zones may be controlled by a fluid circulated through a fluid channel embedded in the body of the support plate 164, as will be discussed in further detail below.

Figure 2:
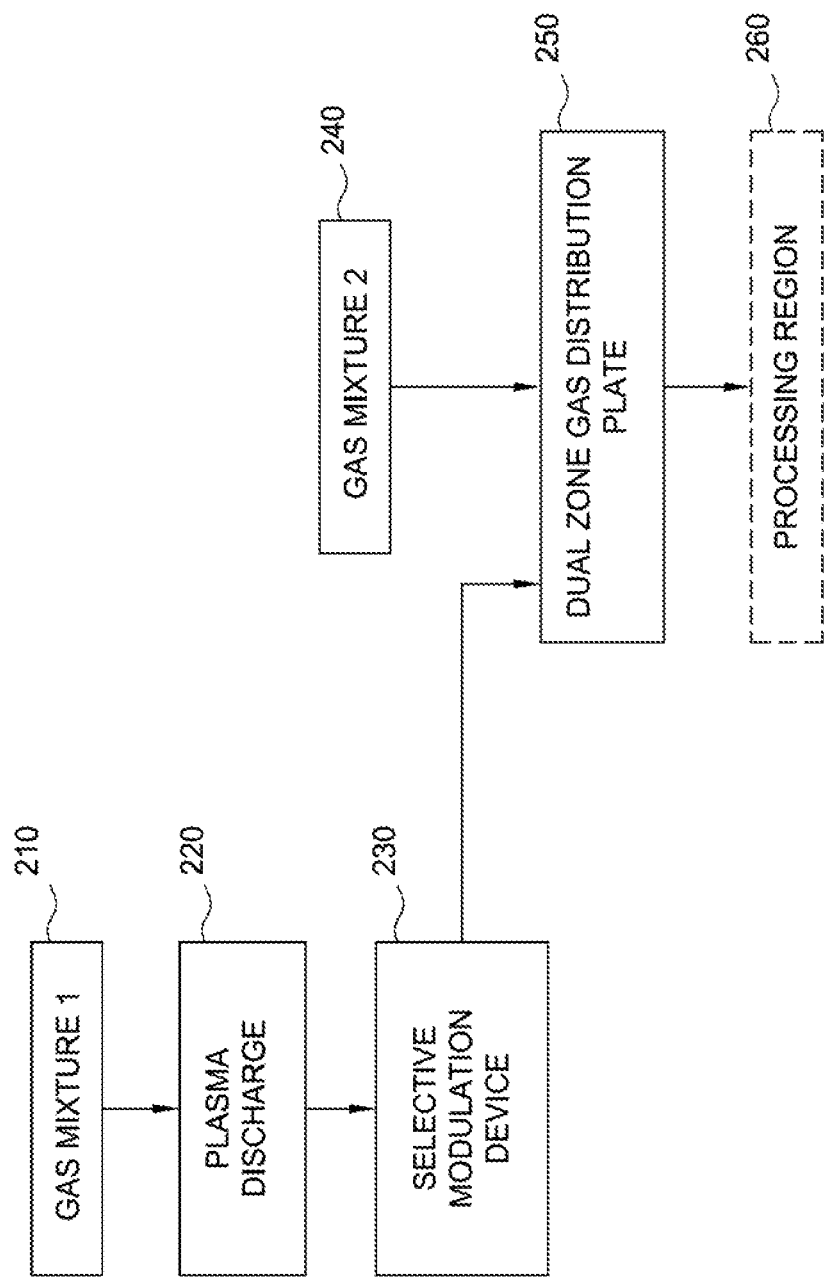
FIG. 2 is a simplified schematic of the gas flow paths of a pair of gas mixtures through a plasma processing system according to one or more implementations of the present disclosure.

FIG. 2 is a simplified schematic of the gas flow paths of a pair of gas mixtures through a plasma processing system that includes both a selective modulation device and a dual-zone gas distribution plate according to one or more implementations of the present disclosure. At block 210, a first gas, such as a plasma-generating gas mixture, is supplied to the processing chamber via a gas inlet. The first gas may include one or more of the following gases: $F_2$, $NF_3$, Ar, He, etc. Inside the processing chamber, the first gas may be excited through a plasma discharge to form one or more plasma effluents at block 220. Alternatively (or in addition to the in-situ plasma generation) a remote plasma system (RPS) coupled to the processing chamber may be used to generate an ex-situ plasma whose plasma excitation products are introduced into the processing chamber. The RPS plasma excitation products may include ionically-charged plasma species as well as neutral and radical species.

Whether the plasma effluents are generated by an in-situ plasma unit, an RPS unit, or both, they are passed through a selective modulation device in the processing chamber at block 230. The selective modulation device blocks and/or controls the passage of ionic species while allowing the passage of radical and/or neutral species as the plasma activated first gas travels to the processing volume in the processing chamber. At block 240, a second gas may be introduced into the processing chamber. As noted above, the contents of the second gas depend on the process performed. For example, the second gas may include etching compounds (e.g., $NH_3$) for etch processes. Contact and reaction between the first and second gases may be prevented until the gases arrive at the processing volume of the process chamber.

One way to prevent the first and second gases from interacting before the processing volume is to have them flow though separate channels in a dual-zone gas distribution plate. Block 250 shows the activated first gas and second gas passing through a dual-zone gas distribution plate that has a first plurality of channels that permit the activated first gas to pass through the gas distribution plate without interacting with the second gas that passes through a second plurality of channels. After exiting the dual-zone gas distribution plate, the first and second gases may mix together in the processing volume of the processing chamber at block 260. Depending on the process performed, the combined gases may react to etch materials from the substrate, or both.

In accordance with some implementation of the present disclosure, a selective modulation device as described above is used to provide radical and/or neutral species for doping and etching processes. In one implementation, for example, a selective modulation device is used to provide fluorine radicals to selectively dope and etch a metal-containing film. One use for such a process is to remove metal-containing films in three-dimensional device structures. Metal-containing films that may be etched in accordance with implementations of the present disclosure include, for example, tungsten films, hafnium films, zirconium films, tantalum films, titanium films, and the like, as well as silicates and oxides of these films.

The selective modulation device may be used to provide a reactive gas containing fluorine radicals and substantially free or free from ions. In one implementation, the reactive gas containing fluorine radicals comprises, consists of, or essentially consists of less than 10% by volume of ions (e.g., less than 5% by volume of ions; less than 1% by volume of ions, less than 0.1% by volume of ions; less than 0.01% by volume of ions; or 0% by volume based on the total volume of reactive gas). Because most of the charged particles of a plasma are filtered or removed by the selective modulation device, the substrate is typically not biased during the etch process. Such a process using radicals and other neutral species can reduce plasma damage compared to conventional plasma etch processes that include sputtering and bombardment. Implementations of the present disclosure are also advantageous over conventional wet etch processes where surface tension of liquids can cause bending and peeling of small features.

Figure 3:
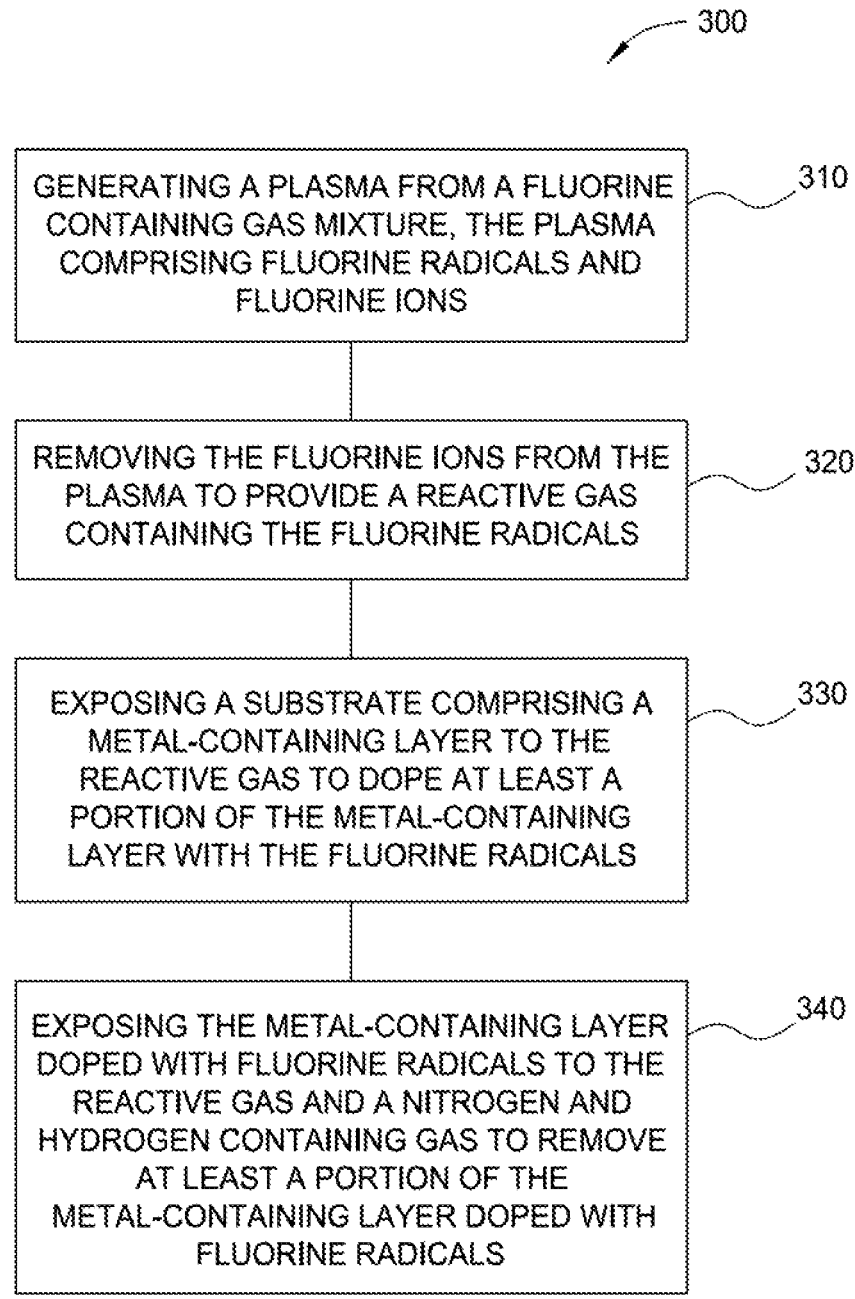
FIG. 3 is a simplified flow chart depicting an exemplary method of etching according to one or more implementations of the present disclosure.

FIG. 3 is a simplified flow chart depicting an exemplary method 300 of selectively etching a metal-containing film from a substrate comprising a metal-containing layer and optionally a silicon oxide layer and/or a silicon nitride layer according to one implementation of the present disclosure. At operation 310, a plasma is generated from a fluorine-containing gas mixture. The plasma comprises, among other things, fluorine radicals and fluorine ions. Operation 310 includes flowing a fluorine-containing gas into a plasma generation volume of a substrate-processing chamber. The fluorine-containing gas may include HF, $F_2$, $NF_3$, $CF_4$, $CHF_3$, $C_2F_6$, $C_3F_6$, $BrF_3$, $ClF_3$, $SF_6$, or the like. Other implementations may include other halogen containing gases, such as $Cl_2$, HBr, $SiCl_4$, or the like, in place of or in addition to the fluorine-containing gas. In the exemplary method 300 of FIG. 3, the fluorine-containing gas mixture may also include one or more oxygen sources such as $O_2$, $O_3$, $N_2O$, NO, or the like. Using oxygen can increase an etch rate of the metal-containing layer with minimal impact on an etch rate of the silicon oxide and/or silicon nitride. The fluorine-containing gas mixture may also include one or more inert gases such as $H_2$, He, $N_2$, Ar, or the like. The inert gas can be used to improve plasma stability. Flow rates and ratios of the different gases may be used to control etch rates and etch selectivity.

In one implementation, the fluorine-containing gas mixture includes $NF_3$ at a flow rate of between about 5 sccm and about 500 sccm (e.g., between about 5 sccm and about 100 sccm; between about 5 sccm and about 10 sccm; between about 10 sccm and about 15 sccm; or about 10 sccm) and He at a flow rate of between about 1,000 sccm and 10,000 sccm (e.g., between about 3,000 sccm and about 6,000 sccm; between about 4,000 sccm and about 5,000 sccm; or about 5000 sccm). One of ordinary skill in the art would recognize that other gases and/or flows may be used depending on a number of factors including processing chamber configuration, substrate size, geometry and layout of features being etched, and the like.

Operation 310 also includes applying energy to the fluorine-containing gas mixture to generate a plasma in the plasma generation volume. As would be appreciated by one of ordinary skill in the art, the plasma may include a number of charged and neutral species including radicals and ions. The plasma may be generated using known techniques (e.g., RF, capacitively coupled, inductively coupled, and the like). In one implementation, the energy is applied using a CCP unit at a source power of between about 15 W and 5,000 W (e.g., between about 20 W and about 200 W; between about 20 W and about 50 W; or between about 30 W and about 40 W) and a pressure of between about 0.2 Torr and 30 Torr (e.g., between about 0.5 Torr and about 8 Torr; between about 0.5 Torr and about 2 Torr; or between about 0.5 Torr and about 1 Torr). The CCP unit may be disposed remote from a processing volume of the processing chamber. For example, the CCP unit and the plasma generation volume may be separated from the processing volume by a selective modulation device.

At operation 320, fluorine ions are removed from the plasma to provide a reactive gas containing fluorine radicals at a higher concentration than fluorine radicals. In one implementation, the reactive gas contains fluorine radicals and is substantially free or free from ions. The plasma may be filtered using a selective modulation device disposed between the plasma generation volume and the processing volume of the substrate-processing chamber. The selective modulation device may include a plurality of channels that allow passage of the fluorine radicals and neutral species between the plasma generation volume and the processing volume. The selective modulation device may be configured to remove some or all of the ions passing from the plasma generation volume. In one implementation, for example, a significant portion of the ions may be removed such that the reactive gas is substantially free from ions.

Operation 320 also includes flowing the reactive gas into a processing volume of the substrate-processing chamber. In one implementation, the selective modulation device may be configured as a gas distribution plate, and the reactive gas exiting the selective modulation device may flow into the processing volume proximate to the substrate. Alternatively, the reactive gas exiting the selective modulation device may flow through a gas distribution plate (e.g., a dual-zone gas distribution plate) or another gas distributor and into the processing volume.

At operation 330, the substrate comprising the metal-containing layer is exposed to the reactive gas to dope a portion of the metal-containing layer with the fluorine radicals. The substrate is exposed to the reactive gas in the processing volume of the substrate-processing chamber. In one implementation, the temperature of the substrate may be between about −10 degrees Celsius and about 200 degrees Celsius (e.g., between about 50 degrees Celsius to about 150 degrees Celsius; between about 50 degrees Celsius to about 100 degrees Celsius; between about 70 degrees Celsius to about 90 degrees Celsius; or between about 75 degrees Celsius to about 80 degrees Celsius), and the pressure in the substrate-processing chamber may be between about 0.2 Torr and 30 Torr (e.g., between about 0.5 Torr and about 8 Torr; between about 0.5 Torr and about 2 Torr; or between about 0.5 Torr and about 1 Torr). One of ordinary skill in the art would recognize that other temperatures and/or pressures may be used depending on a number of factors as explained previously. The fluorine radicals in the reactive gas dope the metal-containing layer.

At operation 340, the doped metal-containing layer is exposed to a reactive gas and a nitrogen and hydrogen containing gas to remove the doped portion of the metal containing layer. In one implementation, the reactive gas is the reactive gas used in operation 330. For example, the reactive gas produced in operations 310 and 320 and used in operation 330 may continue to flow while introducing the nitrogen and hydrogen containing gas.

In another implementation, there is a pause between the doping process of operation 340 and the etching process of operation 340. In some implementations, the processing volume is purged or evacuated to remove doping by-products produced during the doping process.

In some implementations, at operation 340 a plasma is generated from a fluorine-containing gas mixture. The plasma comprises, among other things, fluorine radicals and fluorine ions. Operation 340 includes flowing a fluorine-containing gas mixture including a fluorine-containing gas into a plasma generation volume of a substrate-processing chamber. The fluorine-containing gas may include HF, $F_2$, $NF_3$, $CF_4$, $CHF_3$, $C_2F_6$, $C_3F_6$, $BrF_3$, $ClF_3$, $SF_6$, or the like. Other implementations may include other halogen containing gases, such as $Cl_2$, HBr, $SiCl_4$, or the link, in place of or in addition to the fluorine-containing gas. In the exemplary method of FIG. 3, the fluorine-containing gas mixture may also include one or more oxygen sources such as $O_2$, $O_3$, $N_2O$, NO, or the like. The fluorine-containing gas mixture may also include one or more inert gases such as $H_2$, He, $N_2$, Ar, or the like. The inert gas can be used to improve plasma stability. Flow rates and ratios of the different gases may be used to control etch rates and etch selectivity. In one implementation, the fluorine-containing gas mixture includes $NF_3$ at a flow rate of between about 50 sccm and about 600 sccm (e.g., between about 50 sccm and about 200 sccm; between about 75 sccm and about 150 sccm; between about 100 sccm and about 150 sccm; or about 100 sccm) and He at a flow rate of between about 1,000 sccm and 10,000 sccm (e.g., between about 1,000 sccm and about 5,000 sccm; between about 2,000 sccm and about 3,000 sccm; or about 2000 sccm). One of ordinary skill in the art would recognize that other gases and/or flows may be used depending on a number of factors including processing chamber configuration, substrate size, geometry and layout of features being etched, and the like.

In some implementations, operation 340 also includes applying energy to the fluorine-containing gas mixture to generate a plasma in the plasma generation volume. As would be appreciated by one of ordinary skill in the art, the plasma may include a number of charged and neutral species including radicals and ions. The plasma may be generated using known techniques (e.g., RF, capacitively coupled, inductively coupled, and the like). In one implementation, the energy is applied using a CCP unit at a source power of between about 100 W and 1,000 W (e.g., between about 200 W and about 400 W; between about 200 W and about 300 W; or about 300 W) and a pressure of between about 0.2 Torr and 30 Torr (e.g., between about 0.5 Torr and about 8 Torr; between about 0.5 Torr and about 2 Torr; or between about 0.5 Torr and about 1 Torr). The CCP unit may be disposed remote from a processing volume of the processing chamber. For example, the CCP unit and the plasma generation volume may be separated from the processing volume by a selective modulation device.

In some implementations, operation 340 also includes flowing the reactive gas into a processing volume of the substrate-processing chamber. In one implementation, the selective modulation device may be configured as a gas distribution plate, and the reactive gas exiting the selective modulation device may flow into the processing volume proximate to the substrate. Alternatively, the reactive gas exiting the selective modulation device may flow through a gas distribution plate (e.g., a dual-zone gas distribution plate) or another gas distributor and into the processing volume.

The nitrogen and hydrogen containing gas may be supplied to the gas distribution plate by a secondary gas feed. The nitrogen and hydrogen containing gas may include hydrogen ($H_2$), nitrogen ($N_2$), ($NH_3$), or combinations thereof. In one implementation, the nitrogen and hydrogen containing gas includes $NH_3$ at a flow rate of between about 50 sccm and about 1,000 sccm (e.g., between about 400 sccm and about 600 sccm; between about 400 sccm and about 500 sccm; or about 500 sccm). Not to be bound by theory but it is believed that the nitrogen and hydrogen containing gas meets with the fluorine radicals to form some species of $NH_3.H$. The species of $NH_3.H$ etches away the fluorine doped metal-containing material.

The removed doped portion of the metal containing layer may be vaporized and pumped out of the chamber.

EXAMPLES

The following non-limiting examples are provided to further illustrate implementations described herein. However, the examples are not intended to be all-inclusive and are not intended to limit the scope of the implementations described herein.

Experimental data depicted in Table 1 verifies that hafnium oxide thickness was reduced using the two-operation doping/etching process described herein. The hafnium oxide atomic count in the solid surface was measured by x-ray photoelectron spectroscopy (XPS) and then hafnium oxide thickness was calculated. Other experimental data, which is not shown, demonstrated that no hafnium oxide thickness reduction was achieved if the doping process was skipped and only the etching process was performed.

TABLE 1

| test split | Operation 1 process time | Operation 2 process time | Original $HfO_2$ thickness | After process $HfO_2$ thickness |
|---|---|---|---|---|
| 1 | 30 sec | 60 sec | 14.9 A | 9.4 A |
| 2 | 30 sec | 60 sec | 9.4 A | 6.9 A |
| 3 | 30 sec | 0 sec | 14.4 A | 14.4 A |

Figure 4:
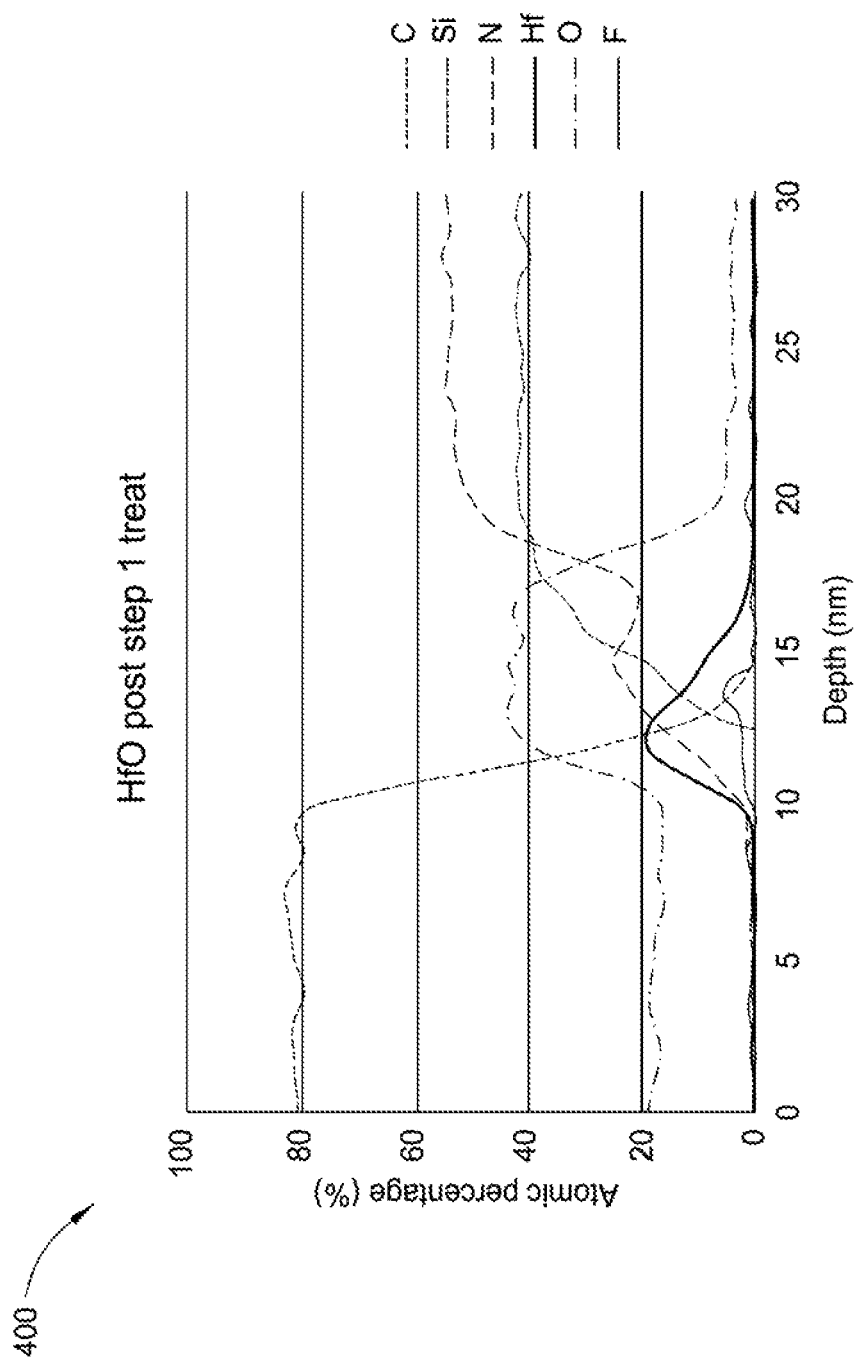
FIG. 4 is plot depicting a depth profile of a hafnium oxide layer on top of a silicon nitride layer after the fluorine radical treatment according to one or more implementations described herein.

FIG. 4 is plot 400 depicting a depth profile of a hafnium oxide layer on top of a silicon nitride layer after the fluorine radical treatment according to one or more implementations described herein. The plot 400 depicts a depth profile (by a technique called Electron Energy Loss Spectrum) of a two nanometer thick hafnium oxide layer on top of silicon nitride substrate. Plot 400 demonstrates that after the fluorine radical treatment fluorine is present inside the hafnium oxide layer. The carbon content is due to the sample preparation process.

In summary, some of the benefits of the present disclosure provide a process that primarily uses radicals generated through a plasma source and is substantially free or free from ions to selectively react with a film. The ability to etch without ions reduces charge build-up in the film. Further, the methods of the present disclosure may be used to etch materials, such as hafnium oxide, which are difficult to etch using fluorine ions. In addition, unlike traditional wet etch methods; the methods of the present disclosure may be used to tech small features without causing pattern collapse. Advantageously, the radical only etch process does not induce charge build-up while reducing damage to the substrate and features formed on the substrate.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the present disclosure may be devised without departing from the basic scope thereof, and the scope thereof is determined by the claims that follow.

The invention claimed is:
1. A method comprising:
   flowing a fluorine-containing gas mixture into a plasma generation volume of a substrate-processing chamber;
   applying energy to the fluorine-containing gas mixture to generate a plasma in the plasma generation volume, the plasma comprising fluorine radicals and fluorine ions;
   filtering the plasma to provide a reactive gas having a higher concentration of fluorine radicals than fluorine ions;
   flowing the reactive gas into a processing volume of the substrate-processing chamber, wherein the processing volume contains a substrate comprising a hafnium oxide containing layer;
   exposing the substrate to the reactive gas in the processing volume of the substrate-processing chamber, wherein the reactive gas dopes at least a portion of the hafnium oxide containing layer to form a hafnium oxide containing layer doped with fluorine radicals;
   purging the processing volume to remove doping by-products; and,
   exposing the hafnium oxide layer doped with fluorine radicals to a nitrogen and hydrogen containing gas mixture and the reactive gas to remove at least a portion of the hafnium oxide layer doped with fluorine radicals, wherein the fluorine-containing gas mixture is free from the nitrogen and hydrogen containing gas mixture.

2. The method of claim 1, wherein the reactive gas and the nitrogen and hydrogen containing gas mixture are mixed in a dual-zone gas distribution plate prior to entering the processing volume.

3. The method of claim 1, wherein the fluorine-containing gas mixture comprises $NF_3$, $F_2$, or both.

4. The method of claim 3, wherein the fluorine-containing gas mixture further comprises at least one of He or Ar.

5. The method of claim 1, wherein the nitrogen and hydrogen containing gas mixture comprises $N_2$, $H_2$, $NH_3$, or combinations thereof.

6. The method of claim 5, wherein the nitrogen and hydrogen containing gas mixture further comprises He or Ar.

7. The method of claim 1, wherein energy is applied to the fluorine-containing gas mixture using a capacitively coupled plasma unit.

8. The method of claim 1, wherein the reactive gas is substantially free from fluorine ions.

9. The method of claim 1, wherein the plasma is filtered using a selective modulation device disposed between the plasma generation volume and the processing volume of the substrate-processing chamber, the selective modulation device comprising a plurality of channels that allow passage of fluorine radicals between the plasma generation volume and the processing volume.

10. A method comprising:
generating a plasma from a fluorine-containing gas mixture, the plasma comprising fluorine radicals and fluorine ions;
removing the fluorine ions from the plasma to provide a reactive gas having a higher concentration of fluorine radicals than fluorine ions;
exposing a substrate comprising a hafnium oxide containing layer to the reactive gas, wherein the reactive gas dopes at least a portion of the hafnium oxide containing layer to form a hafnium oxide containing layer doped with fluorine radicals;
purging the processing volume to remove doping by-products; and,
exposing the hafnium oxide containing layer doped with fluorine radicals to a nitrogen and hydrogen containing gas mixture and the reactive gas to remove at least a portion of the hafnium oxide layer doped with fluorine radicals, wherein the fluorine-containing gas mixture is free from the nitrogen and hydrogen containing gas mixture.

11. The method of claim 10, wherein the fluorine-containing gas mixture comprises $NF_3$, $F_2$, or both.

12. The method of claim 11, wherein the fluorine-containing gas mixture further comprises at least one of He or Ar.

13. The method of claim 10, wherein the nitrogen and hydrogen containing gas mixture comprises $N_2$, $H_2$, $NH_3$, or combinations thereof.

14. The method of claim 13, wherein the nitrogen and hydrogen containing gas mixture further comprises He or Ar.

15. A method comprising:
generating a plasma from a fluorine-containing gas mixture comprising $NF_3$ and He, the plasma comprising fluorine radicals and fluorine ions;
removing a portion of the fluorine ions from the plasma to provide a reactive gas containing the fluorine radicals and substantially free from ions;
exposing a substrate comprising a hafnium oxide-containing layer to the reactive gas, wherein the reactive gas dopes at least a portion of the hafnium oxide-containing layer to form a hafnium oxide-containing layer doped with fluorine radicals;
purging the processing volume to remove doping by-products; and
exposing the hafnium oxide-containing layer doped with fluorine radicals to an ammonia ($NH_3$) containing gas mixture and the reactive gas to remove at least a portion of the hafnium oxide-containing layer doped with fluorine radicals, wherein the fluorine-containing gas mixture is free from the ammonia ($NH_3$) containing gas mixture.

16. The method of claim 15, wherein the reactive gas and the ammonia ($NH_3$) containing gas mixture are mixed in a dual-zone gas distribution plate.

* * * * *